(12) United States Patent
Reaves

(10) Patent No.: US 9,754,641 B1
(45) Date of Patent: Sep. 5, 2017

(54) TUNABLE SENSE AMPLIFIER REFERENCE FOR SINGLE-ENDED BIT LINES

(71) Applicant: Kilopass Technology, Inc., San Jose, CA (US)

(72) Inventor: Jimmy Lee Reaves, San Jose, CA (US)

(73) Assignee: Kilopass Technology, Inc., San Jose, CA (US)

( * ) Notice: Subject to any disclaimer, the term of this patent is extended or adjusted under 35 U.S.C. 154(b) by 0 days.

(21) Appl. No.: 15/354,397

(22) Filed: Nov. 17, 2016

(51) Int. Cl.
*G11C 7/06* (2006.01)
*G11C 7/08* (2006.01)
*G11C 5/14* (2006.01)

(52) U.S. Cl.
CPC .............. *G11C 7/062* (2013.01); *G11C 5/147* (2013.01); *G11C 7/08* (2013.01)

(58) Field of Classification Search
CPC ............ G11C 7/062; G11C 7/08; G11C 5/147
See application file for complete search history.

(56) References Cited

U.S. PATENT DOCUMENTS

| | | | | |
|---|---|---|---|---|
| 5,773,967 A * | 6/1998 | Tenten | ................... | G01R 35/00 323/313 |
| 7,633,333 B2 * | 12/2009 | Ma | ........................... | G05F 3/30 323/313 |
| 8,816,668 B2 * | 8/2014 | Ryu | ....................... | G11C 5/147 323/314 |
| 2005/0127987 A1 * | 6/2005 | Sato | ......................... | G05F 3/30 327/539 |

* cited by examiner

*Primary Examiner* — Vanthu Nguyen
(74) *Attorney, Agent, or Firm* — Aka Chan LLP

(57) ABSTRACT

For a block of memory cells interconnected by single-ended bit lines, a sense amplifier receives the input from a single-ended bit line to determine the logic state of a selected memory cell connected to the single-ended bit line. The sense amplifier also receives a reference voltage generated from a base-emitter voltage of a emitter follower bipolar transistor. The base-emitter voltage is controllably divided by a voltage divider network with selectable resistive elements to tune the reference voltage.

20 Claims, 3 Drawing Sheets

TUNABLE SENSE AMPLIFIER REFERENCE FOR SINGLE-ENDED BIT LINES

BACKGROUND OF THE INVENTION

This invention relates to sense amplifiers and, more particularly, to sensing circuits of single-ended bit lines in arrays of semiconductor memory cells.

In semiconductor memory cell arrays, sense amplifiers are commonly used to determine the logic state of the memory cells in the arrays. Each cell is accessed by a plurality of word and bit lines which are conventionally arranged perpendicularly to each other. In the integrated circuit conductive lines, typically termed bit lines, carry the bit information representing the logic state of a memory cell from (and to) the memory cell when address signals engage decoder circuits which electrically connect the selected memory cell to a sense amplifier by one or two bit line(s) which then reads the logic state of the cell. Of the plurality of memory cells connected to the bit line(s), the decoder circuits send a signal to the word line to the selected memory cell make the electrical connection to the bit line(s), while signals to the word lines to the other memory cells physically connected to the bit line ensure that those memory cell are not electrically connected.

In memory cells in which the logic state is stored as the difference between two signals, such as in an SRAM (Static Random Access Memory) cell, the sense amplifier uses the two complementary signals from a selected memory cell over two bit lines to switch the sense amplifier into one state or another in a read operation. For memory cells in which the logic state is stored as a single signal, such as a DRAM (Dynamic Random Access Memory) cell, the sense amplifier compares the voltage of the single signal carried over a single, or alternatively termed single-ended, bit line from the selected memory cell against a reference voltage to determine the logic state in the selected memory cell.

Hence a reference voltage must be generated for sensing the logic state of memory cells over a single, or single-ended, bit lines. The reference voltage should be such that the sense amplifier can properly determine the logic state, i.e., "1" or "0", of the selected memory cell. However, variations of the semiconductor manufacturing processes adversely affect the performance of a preset reference voltage. It would be preferable that a reference voltage generating circuit be tunable to compensate for manufacturing process variations to allow a sense amplifier to more accurately determine the logic states of memory cells. Furthermore, the reference voltage generating circuit should be small and compact to occupy a minimal amount of valuable space on the integrated circuit substrate surface.

BRIEF SUMMARY OF THE INVENTION

The present invention provides for a sensing circuit for a plurality of memory cells connected to a bit line in an integrated circuit. The sensing circuit comprises a sense amplifier having a first input connected to the bit line, and a reference voltage generation circuit. The reference voltage generation circuit has a bipolar transistor and voltage divider network. The bipolar transistor has a base, a collector connected to a first voltage supply, and an emitter connected to a second voltage supply. The voltage divider network is connected between the base and emitter of the bipolar transistor, and includes a first circuit branch having a selected impedance connected between the base of the bipolar transistor and an output terminal, and a second circuit branch having a selected impedance connected between the output terminal and the emitter of the bipolar transistor. The output terminal is connected to a second input of the sense amplifier to provide a tuned reference voltage responsive to the selected impedances of the first and second circuit branches so that the sense amplifier senses the logic state of a memory cell selected from the plurality of memory cells through the bit line with respect to the tuned reference voltage on the output terminal.

The present invention provides for a reference voltage generation circuit in an integrated circuit having a plurality of memory cells and a sense amplifier connected to the memory cells by single bit line. The reference voltage generation circuit provides a reference voltage to the sense amplifier and comprises a bipolar transistor and a voltage divider network. The bipolar transistor has a base, a collector connected to a first voltage supply, and an emitter connected to a second voltage supply. The voltage divider network is connected between the base and emitter of the bipolar transistor, and includes a first circuit branch having a selected impedance connected between the base of the bipolar transistor and an output terminal, and a second circuit branch having a selected impedance connected between the output terminal and the emitter of the bipolar transistor. The output terminal is connected to a second input of the sense amplifier to provide a tuned reference voltage responsive to the selected impedances of the first and second circuit branches so that the sense amplifier senses the logic state of a selected memory cell through the bit line with respect to the tuned reference voltage on the output terminal.

The present invention provides for a method of reading the logic state of a selected memory cell in an integrated circuit, the selected memory cell part of a plurality of memory cells connected to a sense amplifier by a single bit line. The method comprises generating a base-emitter voltage from a bipolar transistor having a collector connected to a first voltage supply; dividing the base-emitter voltage with a voltage divider network having a first circuit branch having a first selected impedance, and a second circuit branch having a selected second impedance, the first and second circuit branches connected in series across the base-emitter voltage and the first and second selected impedances defining a tuned reference voltage on an output terminal between the first and second circuit branches; and sensing the voltage on the single bit line with respect to the tuned reference voltage with the sense amplifier so that whereby the sense amplifier determines the logic state of the selected memory cell.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
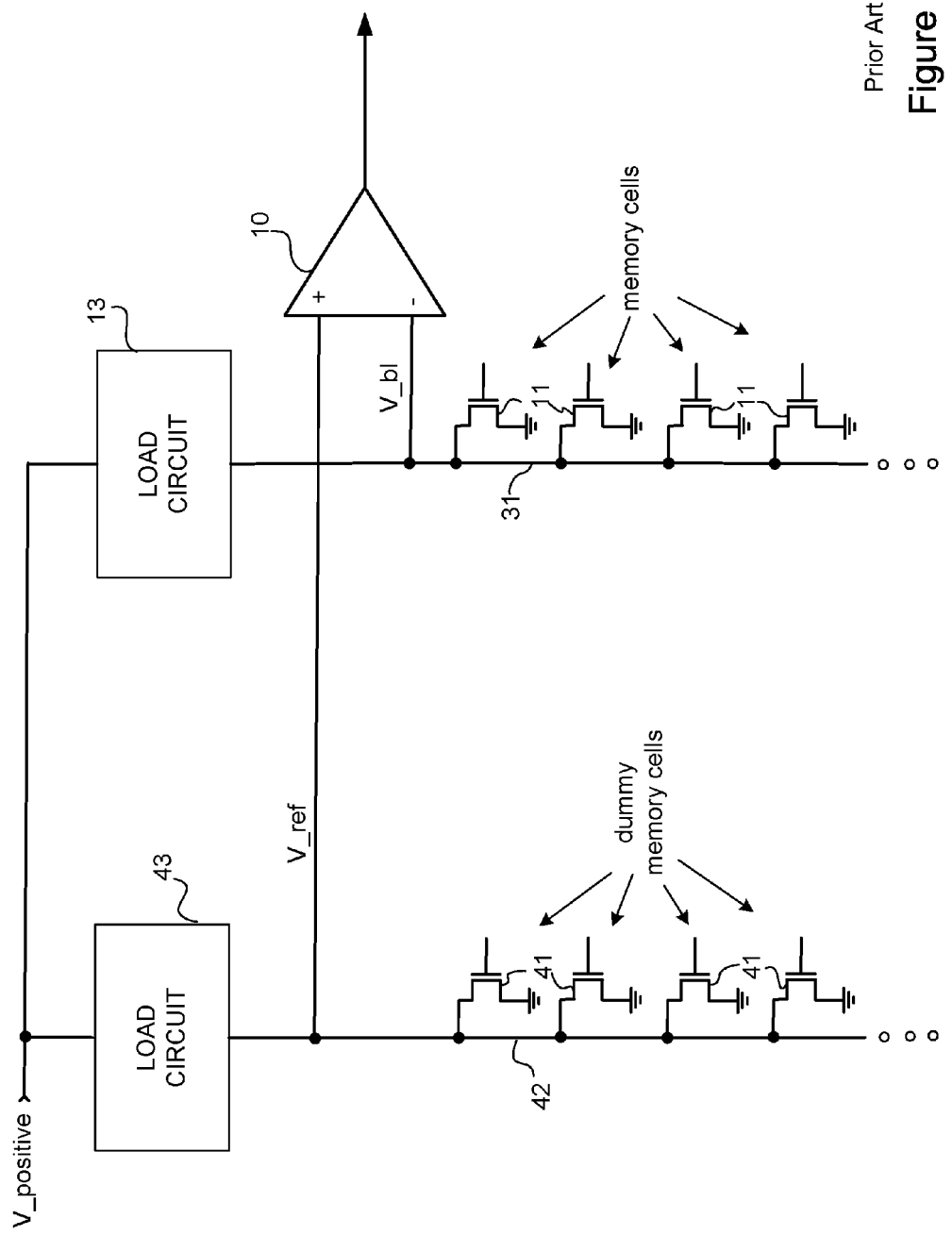
FIG. 1 shows a prior art technique for reading memory cells on a single-ended bit line.

FIG. 1 shows the prior art approach part of an array of memory cells. A plurality of memory cells 11 are physically connected to one input of a sense amplifier 10 by a single bit line 31. It should be understood that the memory cells 11 in FIG. 1 are representations of memory cells connected to a single bit line. One of the memory cells 11 is to be selected for reading. Word lines connected to the gates of MOS transistors representing the memory cells 11 are not shown in the drawing. Besides being connected to a plurality of memory cells 11, the bit line 31 is connected to an upper voltage supply at reference voltage at $V_{positive}$ and has a load 13 representative of the loads from circuits connected to the bit line 31, such as bit line selection and decoder circuits.

To read a selected memory cell connected to the bit line 31, the sense amplifier 10 compares the voltage $V_{bl}$ on the bit line 31 as set by the selected memory cell 11 against a against a dummy memory cell 41 connected to a dummy bit line 42. The dummy bit line 42 is also connected to a dummy load circuit 43 to provide the same load as the load circuit 13 does to the bit line 31. The dummy bit line 42 has one-half the capacitance as the bit line 31. Alternatively, the dummy memory cells 41 are designed to have one-half the drive strength of the ordinary memory cells 11 when the memory cells are read. One way of decreasing the drive strength of the dummy cells 42 is to make the dimensions of the dummy cell transistors smaller. In both cases the dummy bit line 42 supplies a reference voltage $V_{ref}$ which is intermediate of $V_{bl}$ for the selected memory cell being in a logic "1" or logic "0" state during a read operation.

The present invention follows a different approach. Embodiments of the present invention include a bipolar transistor (either NPN or PNP) biased as an emitter follower. Placed across the emitter-base junction of the bipolar transistor is a voltage divider network made of selectable resistive elements such that the divider ratio can be tuned by digital signals. As the voltage across the emitter-base junction ($V_{be}$) of the bipolar transistor is a relatively weak function of the bias current, $V_{be}$ is relatively constant. Absolute constancy is not required. The voltage divider network is tunable by selections of the resistive elements in a series-parallel network of MOS transistors and resistors. The voltage divider network is configured to present one impedance from the output to the base of the bipolar transistor, and another independent impedance from the output to the emitter of the bipolar transistor.

Figure 2:
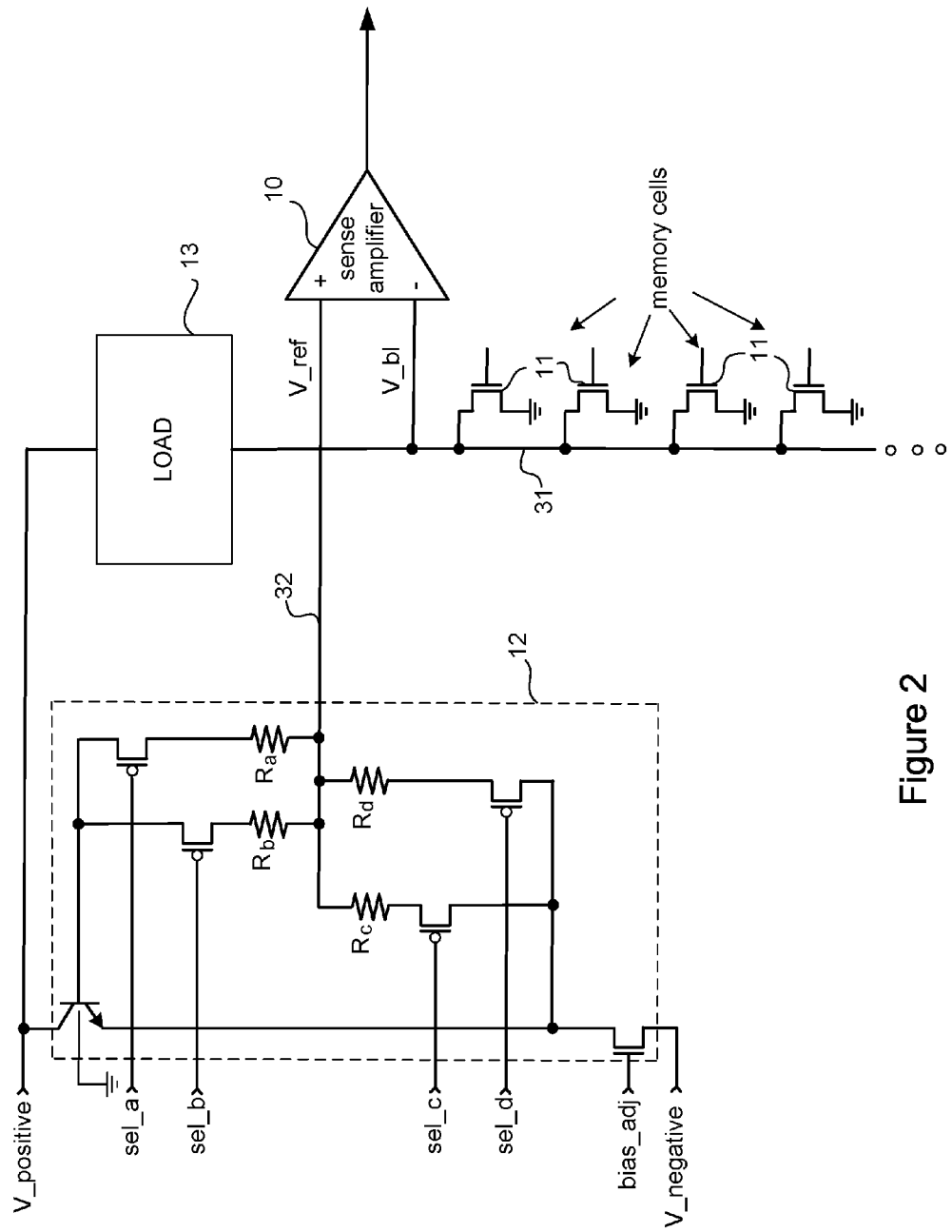
FIG. 2 shows one embodiment of the present invention in which a bipolar transistor and voltage divider network create a reference voltage.

FIG. 2 shows an example of one embodiment of the present invention with part of an array of memory cells shown in FIG. 1 for comparison's sake. The plurality of memory cells 11 are physically connected to one input of the sense amplifier 10 by the single bit line 31. To read a selected memory cell connected to the bit line 31, the sense amplifier 10 compares the voltage $V_{bl}$ on the bit line 31 as set by the selected memory cell 11 against a reference voltage $V_{ref}$ on a signal line 32 from a reference voltage generation circuit 12. The reference voltage $V_{ref}$ is tunable and is adjusted so that the sense amplifier 10 can determine the logic state of a selected memory cell 11 under optimum conditions. This "tuning" of the reference voltage generation circuit 12 can be performed at the factory.

Figure 3:
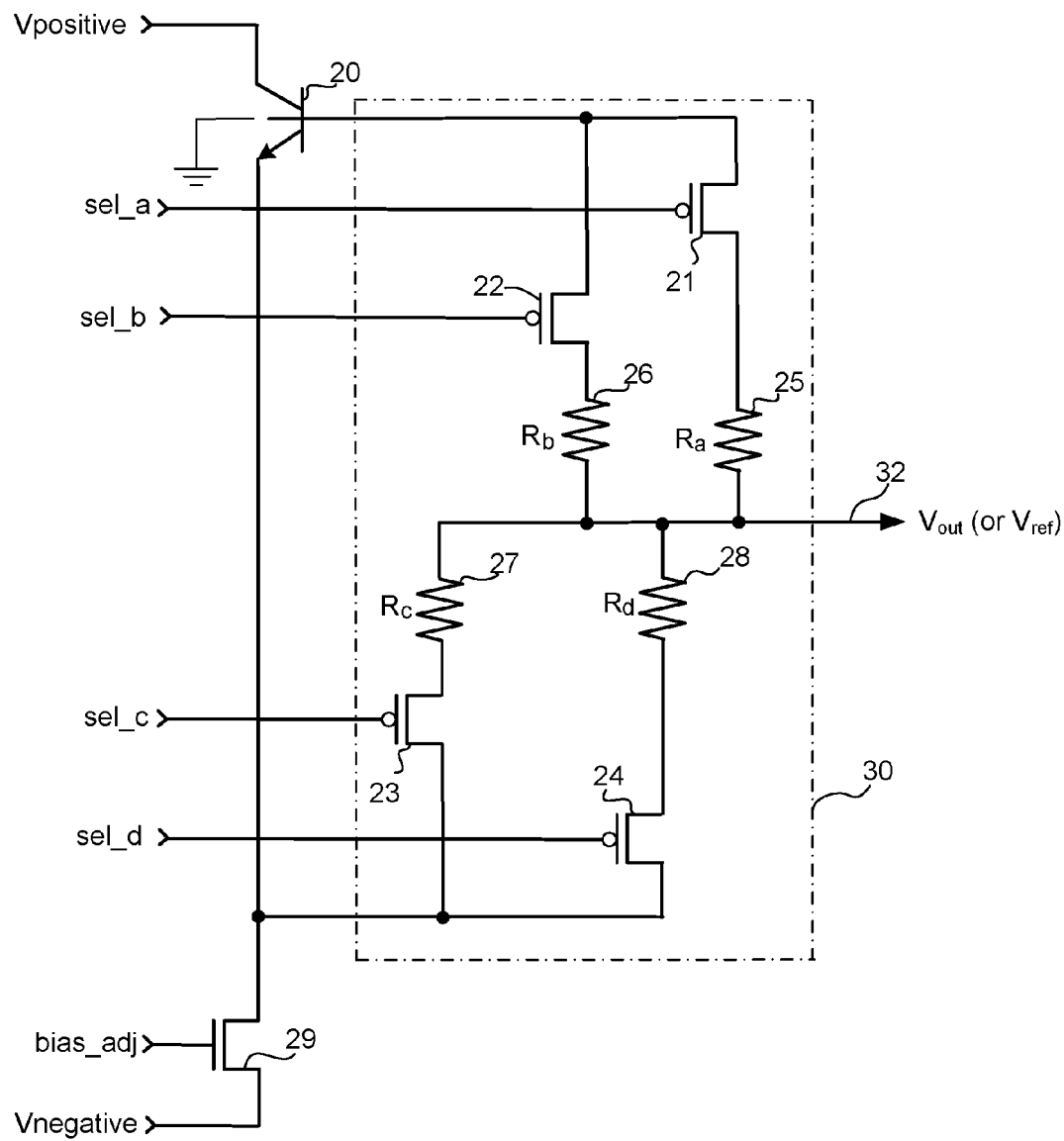
FIG. 3 shows an isolated view of the FIG. 2 voltage divider circuit.

FIG. 3 shows the reference voltage generation circuit 12 in FIG. 2 in isolation. The reference voltage generation circuit 12 has a bipolar transistor connected as an emitter follower and a voltage divider network. In this embodiment the bipolar transistor is an NPN transistor 20 which is connected to a voltage divider network 30. The NPN transistor 20 has its collector connected to an upper supply voltage at $V_{positive}$, its emitter connected to a lower supply voltage at $V_{negative}$ through an NMOS transistor 20, and its base connected to the voltage divider network. The terms, $V_{positive}$ and $V_{negative}$, are used here in the sense that $V_{positive}$ is positive, or higher, than $V_{negative}$ and vice versa.

The voltage divider network 30 connected between the base and emitter of the NPN transistor 20 has an output terminal which is connected to the sense amplifier 10 by the conducting line 32. See FIG. 1. The output terminal is connected to the base of the NPN transistor 20 by one circuit branch formed by a plurality of parallel-connected paths of resistive elements and PMOS transistors. In the example circuit of the FIG. 2 there are two paths; one path has a PMOS transistor 21 and a resistive element in the form of resistor 25 connected in series, and the second path has a PMOS transistor 22 and a resistor 26 connected in series. Both paths are connected in parallel between the base of the NPN transistor 20 and the output terminal. The voltage divider network 30 is connected between the output terminal and the lower supply voltage at $V_{negative}$ through the NMOS transistor 29 by a second circuit branch also formed by a plurality of parallel-connected paths of resistive elements and PMOS transistors. In this example there are two paths. One path has a PMOS transistor 23 and a resistive element in the form of a resistor 27 connected in series, and the second path has a PMOS transistor 24 and a resistor 28 connected in series. Both paths are connected in parallel between the output terminal and the lower reference voltage at $V_{negative}$ through the NMOS transistor 20. Each circuit branch can have additional paths with selected resistive elements to increase the tunable options for $V_{out}$.

The output terminal voltage $V_{out}$, which is the reference voltage to the sense amplifier 20, is tuned by selecting different paths through the voltage divider network 30. Selection is made by setting signals sel_a, sel_b, sel_c and sel_d on the gates of the PMOS transistors 21, 22, 23 and 24 respectively to turn different combinations of the PMOS transistors 21, 22, 23 and 24 on into conducting states to create selected paths in the voltage divider network 30. Each selected path has a particular resistance, e.g., $R_a$, $R_b$, $R_c$ and $R_d$ for the different paths shown in FIG. 2. By turning the PMOS transistors 21, 22, 23 and 24 off and on, different combinations of resistance values can be selected for the voltage divider network and consequently different $V_{out}$ values can be generated. Calculation for $V_{out}$ is easily determined by the well-known voltage divider equation which determines the voltage from the ratio of the resistances in the two circuit branches. The resistance in each circuit branch is determined by the parallel resistances of the conducting paths in the circuit branch.

The output voltage $V_{out}$ can be further adjusted by changing the voltage on the gate of the NMOS transistor 29. The NMOS transistor 29 provides a "fine-adjust" of the $V_{out}$ from the voltage divider network 30. For example, the bipolar $V_{be}$ is not constant, but for a given bias current, changes about 2 mV/C.°. The NMOS transistor 29 can be used as the output device of a temperature-compensated constant-current source, holding the bipolar $V_{be}$ within a desired range by increasing or decreasing the bias current. While a typical NMOS transistor current/voltage characteristic of 60 mV/Decade would seem extreme, the current through the NMOS transistor 29 allows a certain amount of control on the reference value $V_{out}$.

The resistive elements 25-28 have been described as resistors. They can be implemented by polysilicon resistors, diffusion resistors and MOS transistors. MOS transistors are preferable for purposes of space savings on the integrated circuit substrate surface, and, as is well known to integrated circuit designers, MOS transistors make quite effective transistors.

The embodiment of the present invention in FIGS. 2 and 3 show PMOS transistors in the voltage divider network operating on the $V_{be}$ of an NPN bipolar transistor. It is also possible to use NMOS transistors in the voltage divider network with the $V_{be}$ of a PNP bipolar transistor. In this case, the polarities of the voltage supplies are reversed with the collector voltage of the PNP bipolar transistor negative with respect to the voltage.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A sensing circuit for a plurality of memory cells connected to a bit line in an integrated circuit, the sensing circuit comprising:
a sense amplifier having a first input connected to the bit line;
a reference voltage generation circuit having:
a bipolar transistor having a base, a collector connected to a first voltage supply, and an emitter connected to a second voltage supply;
a voltage divider network connected between the base and emitter of the bipolar transistor, the voltage divider network including a first circuit branch having a selected impedance and connected between the base of the bipolar transistor and an output terminal, and a second circuit branch having a selected impedance and connected between the output terminal and the emitter of the bipolar transistor, the output terminal connected to a second input of the sense amplifier to provide a tuned reference voltage responsive to the selected impedances of the first and second circuit branches for the sense amplifier;
whereby the sense amplifier senses the logic state of a memory cell selected from the plurality of memory cells through the bit line with respect to the tuned reference voltage on the output terminal.

2. The circuit of claim 1 wherein the first circuit branch of the voltage divider network comprises a plurality of potential parallel paths, each path having a first MOSFET (Metal-Oxide-Semiconductor Field Effect Transistor) and a resistive element connected in series, the impedance of the first circuit branch being selected by turning one or more selected first MOSFETs into a conducting state.

3. The circuit of claim 1 wherein the second circuit branch of the voltage divider network comprises a plurality of potential parallel paths, each path having a first MOSFET and a resistive element connected in series, the impedance of the second circuit branch being selected by turning one or more selected first MOSFETs into a conducting state.

4. The circuit of claim 1 wherein the first and second circuit branches of the voltage divider network each comprises a plurality of potential parallel paths, each path having a first MOSFET and a resistive element connected in series, the impedances of the first and second circuit branches each being selected by turning one or more selected first MOSFETs in the first and second circuit branches into a conducting state.

5. The circuit of claim 4 wherein the emitter of the bipolar transistor is connected to the second voltage supply through a second MOSFET, the second MOSFET adjusting the tuned reference voltage responsive to a voltage on a gate of the second MOSFET.

6. The circuit of claim 5 wherein the second MOSFET comprises an NMOS (N-type Metal-Oxide-Semiconductor) transistor.

7. The circuit of claim 4 wherein the bipolar transistor comprises an NPN transistor and each of the first MOSFETs comprises a PMOS (N-type Metal-Oxide-Semiconductor) transistor.

8. The circuit of claim 4 wherein the bipolar transistor comprises a PNP transistor and each of the first MOSFET transistors comprises an NMOS transistor.

9. The circuit of claim 4 wherein each of the resistive elements comprises a resistor.

10. The circuit of claim 4 wherein the first and second circuit branches of the voltage divider network each comprises two potential parallel paths.

11. In an integrated circuit having a plurality of memory cells and a sense amplifier connected to the memory cells by single bit line, a reference voltage generation circuit providing a reference voltage to the sense amplifier comprising:
a bipolar transistor having a base, a collector connected to a first voltage supply, and an emitter connected to a second voltage supply; and
a voltage divider network connected between the base and emitter of the bipolar transistor, the voltage divider network including a first circuit branch having a selected impedance and connected between the base of the bipolar transistor and an output terminal, and a second circuit branch having a selected impedance and connected between the output terminal and the emitter of the bipolar transistor, the output terminal connected to a second input of the sense amplifier to provide a tuned reference voltage responsive to the selected impedances of the first and second circuit branches for the sense amplifier;
whereby the sense amplifier senses the logic state of a selected memory cell through the bit line with respect to the tuned reference voltage on the output terminal.

12. The circuit of claim 11 wherein the first and second circuit branches of the voltage divider network each comprises a plurality of potential parallel paths, each path having a first MOSFET (Metal-Oxide-Semiconductor Field Effect Transistor) and a resistive element connected in series, the impedances of the first and second circuit branches being selected by turning selected first MOSFETs in the first and second circuit branches into a conductive state.

13. The circuit of claim 12 wherein the emitter of the bipolar transistor is connected to the second voltage supply through a second MOSFET, the second MOSFET adjusting the selective reference voltage responsive to a voltage on a gate of the second MOSFET.

14. The circuit of claim 13 wherein the bipolar transistor comprises an NPN transistor and each of the first MOSFETs comprises a PMOS (P-type Metal-Oxide-Semiconductor) transistor.

15. The circuit of claim 13 wherein the second MOSFET comprises an NMOS (N-type Metal-Oxide-Semiconductor) transistor.

16. A method of reading the logic state of a selected memory cell in an integrated circuit, the memory cells connected to a sense amplifier by a single bit line, the method comprising:

generating a base-emitter voltage from a bipolar transistor having a collector connected to a first voltage supply;

dividing the base-emitter voltage with a voltage divider network having a first circuit branch having a first selected impedance, and a second circuit branch having a selected second impedance, the first and second circuit branches connected in series across the base-emitter voltage and the first and second selected impedances defining a tuned reference voltage on an output terminal between the first and second circuit branches; and sensing the voltage on the single bit line with respect to the tuned reference voltage with the sense amplifier;

whereby the sense amplifier determines the logic state of the selected memory cell.

17. The method of claim 16 wherein:

the first and second circuit branches of the voltage divider network each comprises a plurality of potential parallel paths, each potential path having a MOSFET (Metal-Oxide-Semiconductor Field Effect Transistor) and a resistive element connected in series; and the base-emitter voltage dividing step comprises:

defining the impedance of the first circuit branch by current through one or more selected potential paths of the first circuit branch;

defining the impedance of the second circuit branch by current through one or more selected potential paths of the second circuit branch;

whereby the ratio of the first circuit branch impedance to the second circuit branch impedance defines the tuned reference voltage on the output terminal.

18. The method of claim 17 wherein each potential path of the first and second circuit branches has a MOSFET (Metal-Oxide-Semiconductor Field Effect Transistor) and a resistive element connected in series; and a potential path of the first and second circuit branches selected by having the MOSFET in the selected path in a conducting state.

19. The method of claim 18 wherein the each circuit branch comprises two potential parallel paths.

20. The method of claim 17 wherein the bipolar transistor comprises an NPN bipolar transistor and the MOSFET transistors comprise PMOS (P-type Metal-Oxide-Semiconductor) transistors.

* * * * *